United States Patent
Raj et al.

(10) Patent No.: US 9,349,630 B2
(45) Date of Patent: May 24, 2016

(54) METHODS AND APPARATUS FOR ELECTROSTATIC CHUCK REPAIR AND REFURBISHMENT

(71) Applicant: Applied Materials, Inc., Santa Clara, CA (US)

(72) Inventors: Govinda Raj, Bangalore (IN); Robert T. Hirahara, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 49 days.

(21) Appl. No.: 14/162,041

(22) Filed: Jan. 23, 2014

(65) Prior Publication Data

US 2014/0268478 A1 Sep. 18, 2014

Related U.S. Application Data

(60) Provisional application No. 61/792,480, filed on Mar. 15, 2013.

(51) Int. Cl.
| | | |
|---|---|---|
| *H01T 23/00* | (2006.01) | |
| *H01L 21/683* | (2006.01) | |
| *H01L 21/687* | (2006.01) | |
| *H02N 13/00* | (2006.01) | |

(52) U.S. Cl.
CPC ........ *H01L 21/6831* (2013.01); *H01L 21/6833* (2013.01); *H01L 21/68785* (2013.01); *H02N 13/00* (2013.01); *Y10T 29/49718* (2015.01)

(58) Field of Classification Search
CPC ............ H01L 21/6833; H01L 21/6831; H01L 21/67109; H02N 13/00; G03F 7/70708
USPC .................................................. 361/234, 230
See application file for complete search history.

(56) References Cited

U.S. PATENT DOCUMENTS

| | | | |
|---|---|---|---|
| 5,656,093 | A | 8/1997 | Burkhart et al. |
| 5,908,334 | A | 6/1999 | Chen et al. |
| 6,462,928 | B1 | 10/2002 | Shamouilian et al. |
| 6,535,372 | B2 | 3/2003 | Parkhe et al. |
| 6,853,533 | B2 | 2/2005 | Parkhe |
| 8,064,185 | B2 | 11/2011 | Hirahara et al. |
| 8,320,099 | B2 | 11/2012 | Hirahara et al. |
| 2002/0050246 | A1 | 5/2002 | Parkhe |
| 2005/0018377 | A1* | 1/2005 | Cho et al. ....................... 361/234 |
| 2007/0002515 | A1* | 1/2007 | Hino et al. ..................... 361/234 |
| 2010/0061032 | A1* | 3/2010 | Hirahara et al. ............... 361/234 |
| 2011/0217553 | A1* | 9/2011 | Warner et al. ............. 428/402.24 |
| 2013/0082895 | A1* | 4/2013 | Shiu et al. ...................... 343/866 |
| 2013/0160608 | A1* | 6/2013 | Nusko et al. ..................... 75/370 |

FOREIGN PATENT DOCUMENTS

| | | | | |
|---|---|---|---|---|
| CN | 102343698 A | | 2/2012 | |
| JP | 2002-231799 | * | 8/2002 | ............... B23Q 3/15 |
| JP | 2002231799 A | | 8/2002 | |

OTHER PUBLICATIONS

International Search Report and Written Opinion for PCT/US2014/012800 dated Apr. 16, 2014.

* cited by examiner

*Primary Examiner* — Danny Nguyen
(74) *Attorney, Agent, or Firm* — Patterson & Sheridan, LLP

(57) ABSTRACT

In one embodiment of the invention, a substrate support assembly comprises an electrostatic chuck having an electrode embedded therein and having an aperture disposed therethrough, a conductive liner disposed on the surface of the electrostatic chuck within the aperture, a conductive tubing extending from a lower surface of the electrostatic chuck and axially aligned with the aperture, and a conductive coating at least partially within the aperture and at least partially within the conductive tubing, wherein the conductive coating provides a conductive path between the conductive liner and the conductive tubing.

5 Claims, 3 Drawing Sheets

METHODS AND APPARATUS FOR ELECTROSTATIC CHUCK REPAIR AND REFURBISHMENT

CROSS-REFERENCE TO RELATED APPLICATION

This application claims benefit of U.S. Provisional Patent Application Ser. No. 61/792,480, filed Mar. 15, 2013, which is hereby incorporated by reference herein.

BACKGROUND

1. Field

Embodiments of the present invention generally relate to apparatus and methods for refurbishing an electrostatic chuck. More specifically, to repairing a severed electrical connection in the balancing circuit of an electrostatic chuck.

2. Description of the Related Art

In substrate processing equipment, an electrostatic chuck is commonly used for clamping a substrate to a pedestal during processing. The electrostatic chuck clamps the substrate by creating an attractive force between the substrate and the chuck. A voltage is applied to one or more electrodes in the chuck to induce oppositely polarized charges in the substrate and the electrodes, respectively. The opposite charges pull the substrate against the chuck, thereby retaining the substrate.

In a bipolar, electrostatic chuck, a chuck body has a pair of coplanar electrodes embedded therein. Each electrode is respectively connected to a terminal of a dual power supply having a common terminal, which is referred to as a center tap. The center tap is connected to a substrate spacing mask provided on the surface of the chuck in order to balance any variations in the impedance between the substrate and the electrodes. Thus, a constant electrostatic attraction force between the substrate and the chuck is maintained across the surface of the chuck.

The electrical connection between the center tap and the substrate spacing mask is often made through the conductive wall of a gas conduit used to supply gas to the backside of the substrate during processing. The gas conduit is attached to a metalized central bore within the chuck body. This connection works well during substrate processing, but the conductive connection is sometimes disrupted or otherwise compromised over time. While the conductive connection may remain mechanically sound, the connection may not be effectual in conducting electric current, which results in improper or dysfunctional operation of the electrostatic chuck.

Conventional repair methods include re-establishing the conductive connection using welding techniques, such as electron beam welding or laser welding techniques. However, these methods are expensive and time consuming, which increases cost of ownership and extends chamber downtime.

Therefore, a need exists for apparatus and methods of restoring a compromised balancing circuit electrical connection in an electrostatic chuck.

SUMMARY

In one embodiment of the invention, a substrate support assembly comprises an electrostatic chuck having an electrode embedded therein and having an aperture disposed therethrough, a conductive liner disposed on the surface of the electrostatic chuck within the aperture, a conductive tubing extending from a lower surface of the electrostatic chuck and axially aligned with the aperture, and a conductive coating at least partially within the aperture and at least partially within the conductive tubing, wherein the conductive coating provides a conductive path between the conductive liner and the conductive tubing.

In another embodiment, a method for repairing a severed electrical connection within a balancing circuit of an electrostatic chuck assembly comprises applying a conductive fluid across the severed electrical connection, and curing the conductive fluid to establish a conductive path across the severed electrical connection.

In another embodiment, a method for repairing a severed electrical connection within a balancing circuit of an electrostatic chuck assembly comprises determining the resistance between a substrate spacing mask disposed on the upper surface of an electrostatic chuck and a conductive tubing extending from the lower surface of the electrostatic chuck and axially aligned with a metallically lined aperture extending through the electrostatic chuck, evaluating the determined resistance to determine whether the electrical connection between the conductive conduit and the substrate mask has been severed, and repairing the severed connection by restoring a conductive path between the conductive tubing and the substrate spacing mask by applying a coating comprising a nano-particle conductive material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention includes methods and apparatus for testing and repairing an electrical connection between bipolar electrodes contained within an electrostatic chuck and a conductive mask disposed atop the electrostatic chuck, particularly after removal of the electrostatic chuck. This connection is known as a balancing circuit because it balances the electrostatic forces applied to a substrate positioned atop the electrostatic chuck.

In one embodiment, the electrostatic chuck is tested to determine whether the balancing circuit electrical connection has been disrupted. In one embodiment, if the electrical connection has been disrupted, the electrical connection is repaired via a conductive coating process.

Figure 1:
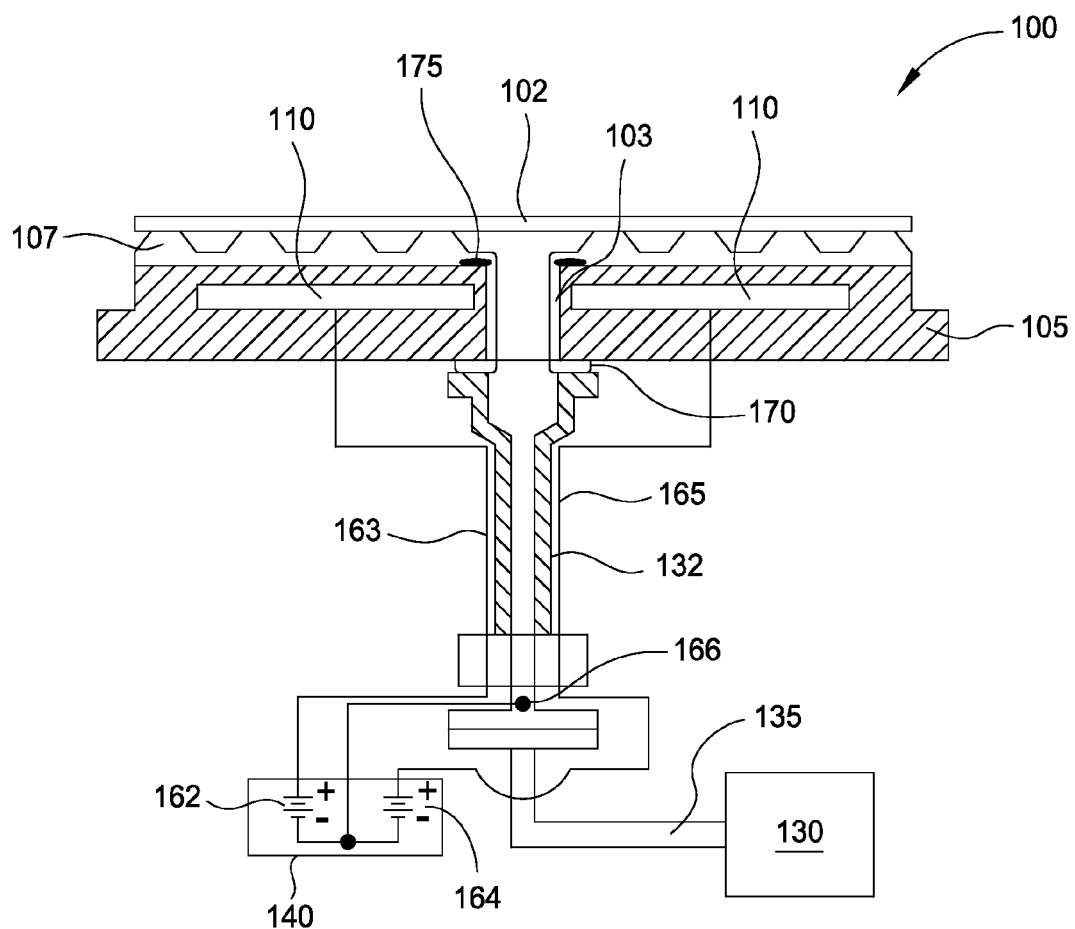
FIG. 1 is a schematic, cross-sectional view of an exemplary substrate support assembly, which may benefit from the present invention.

FIG. 1 is a schematic, cross-sectional view of an exemplary substrate support assembly 100, which may benefit from the present invention. The substrate support assembly 100 includes an electrostatic chuck 105 for supporting and retaining a substrate 102 during processing. The electrostatic chuck 105 may comprise aluminum (Al) or an aluminum containing ceramic material, such as Al/Al$_2$O$_3$/AlN, or other material.

The electrostatic chuck 105 has a substrate spacing mask 107 disposed on the upper surface thereof. The substrate spacing mask 107 may comprise a material such as titanium, titanium nitride, or diamond-like carbon, and the like. The substrate spacing mask 107 is deposited to a pre-defined thickness that maintains the substrate 102 slightly above the surface of the electrostatic chuck 105. The electrostatic chuck 105 further contains a conductive passage 103 disposed therethrough. In one embodiment, the conductive passage 103 electrically couples the substrate spacing mask 107 to the bottom region of the electrostatic chuck 105.

In one embodiment, a heat transfer fluid is transported from a gas source 130 to a conductive gas conduit 132 through a gas conduit 135. The conductive gas conduit 132 is mechanically and electrically coupled to the conductive passage 103, such as by brazing. In one embodiment, the conductive gas conduit 132 is conductive tubing, such as stainless steel tubing. In one embodiment, the conductive gas conduit is axially aligned with the conductive passage 103. Heat transfer fluid is transported through the conductive gas conduit 132 to the passage 103 extending through the electrostatic chuck 105. The gas is further transported through the conductive passage 103 to the backside of the substrate 102. The flow of gas may provide heating or cooling to the backside of the substrate 102. The heat transfer gas may be helium, argon, hydrogen, among others.

The electrostatic chuck 105 includes one or more chucking electrodes 110 embedded therein. The chucking electrodes 110 are fabricated from a conductive material, such as tungsten, graphite, copper, or the like. The chucking electrodes 110 are disposed in an upper region of the electrostatic chuck 105 to provide the necessary electrostatic force to retain the substrate 102 when energized. The chucking electrodes 110 may be configured in any manner necessary to electrostatically retain the substrate 102. However, in the embodiment depicted in FIG. 1, the chucking electrodes 110 are in a bipolar configuration.

The chucking electrodes 110 are connected to a power supply 140 comprising a pair of dual terminal DC voltage supplies 162 and 164 with a center tap 166. The cathode on the voltage supply 162 is coupled to one of the bipolar chucking electrodes 110 via an electrode lead 163, and the anode from the other voltage supply 164 is coupled to the other bipolar chucking electrode 110 via an electrode lead 165. The cathode of the voltage supply 164 is coupled to the anode of the voltage supply 162 with a center tap 166 coupled therebetween. The center tap 166 is further coupled to the substrate spacing mask 107 via the conductive gas conduit 132 and the conductive passage 103. A first brazed joint 170 may be used to electrically and mechanically couple the conductive gas conduit 132 to the conductive passage 103. A metalized layer 175 may be used to electrically and mechanically couple the substrate spacing mask 107 to the conductive passage 103. The first brazed joint 170 and the metalized layer 175 may comprise a conductive metallic material, such as gold (Au), silver (Ag) or aluminum (Al) or other conductive material. In one embodiment, the metalized layer 175 may be a tungsten (W) paste that is sintered to form a metallic layer and electrically connect the substrate spacing mask 107 to the conductive passage 103. The electrical connection between the substrate spacing mask 107 and the conductive passage 103 comprising the metalized layer 175 can also include carbon nano tubes or graphene sheet or foils. The metalized layer 175 can also comprise multiple layers of the conductive metallic material, nano tube, sheets or foil as described herein, that include a corrosion resistant upper layer and a conductive inner metal contact made of nano ink or paste. Thus, a mechanically and electrically stable connection is formed between the center tap 166 and the substrate spacing mask 107. As such, variations in the electrostatic force due to physical variations in the distance between the substrate 102 and the chucking electrode 110 may be balanced. Therefore, changes in the electrostatic force are balanced by having the center tap 166 of the power supply 140 coupled to the substrate spacing mask 107 in a balancing circuit.

Periodic service and maintenance of the substrate support assembly 100 is required during the lifetime of a processing chamber housing the electrostatic chuck 105. Accordingly, the electrostatic chuck 105 may be periodically removed from its processing chamber for refurbishing.

However, it has been discovered that the electrical connection between the conductive gas conduit 132 and the conductive passage 103 may become severed during use and/or during removal of the electrostatic chuck 105. Thus, the balancing circuit between the substrate spacing mask 107 and the chucking electrodes 110 is rendered non-functional.

One embodiment for repairing a severed electrical connection in the balancing circuit of the substrate support assembly 100 involves first testing the assembly to detect whether the connection has been severed and then repairing the severed connection through the use of various techniques and/or devices. First, the substrate support assembly is tested to determine whether the electrical connection between the conductive gas conduit 132 and the conductive passage 103 has been disrupted. In one embodiment, the resistance across the connection may be tested via an ohmmeter. If the resistance is equal to or less than a specified resistance, the connection is intact. If the resistance is greater than the specified resistance, the connection must be repaired. In one embodiment, the required resistance is 200 kilo ohms (kΩ). If the required resistance is not present, the connection is repaired.

Figure 2:
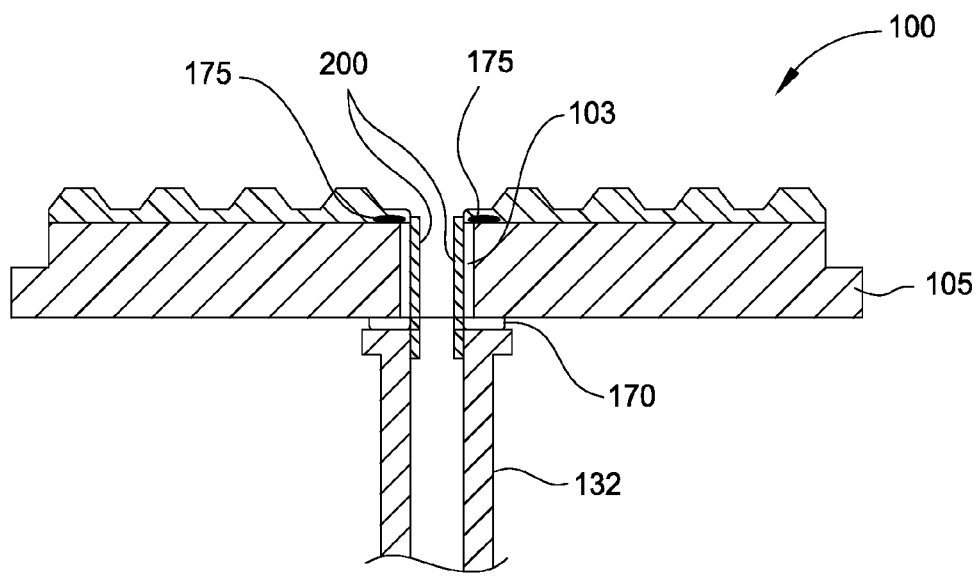
FIG. 2 is a schematic depiction of a substrate support assembly utilizing a method of repairing a severed electrical connection between a conductive gas conduit and a conductive passage according to one embodiment of the present invention.

FIG. 2 is a schematic depiction of a method of repairing the connection between the conductive gas conduit 132 and the conductive passage 103 according to one embodiment of the present invention. The conductive passage 103 may be repaired by applying a coating 200 on the inside of the conductive passage 103. Heat may then be applied to the coating 200 for a specified time period to cure the coating and re-establish electrical continuity for the balancing circuit between the substrate spacing mask 107 and the chucking electrodes 110. In one aspect, the coating 200 bridges and electrically connects the substrate spacing mask 107 to the conductive gas conduit 132.

The coating 200 may comprise a nano-particle based metal coating, such as a silver coating. The coating 200 may be in the form of an ink or a paste that may be applied by a brush, a spray coating technique, or other suitable coating method. Suitable silver materials that may be used to coat the temperature sensor include a material sold under the trade name TEC-PA-030 (or other materials sold under the trade name TEC-PA-XXX, such as TEC-PA-010, TEC-PA-020, etc.), all available from InkTec® Co., LTD of South Korea, or any other suitable conductive nano inks that can be easily cured using IR heating, flame heating, induction heating or furnace heating.

The coating 200 provides good adhesion with the various materials of the electrostatic chuck 105. Thus, the coating 200 may be easily deposited on the surfaces of the first brazed joint 170, the metalized layer 175, and the surfaces of the conductive gas conduit 132. In one embodiment, the coating 200 may be a conductive nano coating/nano ink that is sintered on the electrostatic chuck 105 comprising an Al/Al$_2$O$_3$/AlN, or other material. The coating 200 is used to establish proper electrical contact with the center tap circuit. In one embodiment, the coating 200 comprises a nano silver material that maintains conductivity even when an exposed surface of the coating 200 is oxidized during curing.

The coating 200 includes particles having a size of about 10 nanometers to about 100 nanometers. The coating 200 may be deposited by numerous techniques including spray coating, brush coating, and a printing and firing process. The application process may comprise coating transparent silver nanoparticles in the form of an ink onto the surface. Then, the ink is heated to evaporate and dry, leaving a silver organic transparent film to form a self assembled silver monolayer that forms the coating 200. In one embodiment, the coating 200 includes an electrical resistivity at room temperature (about 27 degrees C.) that is less than about 0.002 micro Ohms per centimeter (μΩ cm).

The coating 200 may be cured by heating. The coating 200 may be heated by numerous techniques including infrared (IR) light, convection heating, microwaves, a flame-treatment, and combinations thereof. In one embodiment, the curing comprises heating the coating 200 to a temperature of about 150 degrees Celsius (° C.) to about 200° C., and maintaining the temperature for about 15 minutes to 30 minutes. After heating the coating 200, a very thin layer (e.g., having a thickness of about 500 nanometers (nm) to about 5 microns, such as about 20 nm to about 100 nm) of electrically conductive material is formed between the conductive gas conduit 132 and the substrate spacing mask 107, which provides electrical continuity between the substrate spacing mask 107 and the center tap 166 (shown in FIG. 1).

Figure 3:
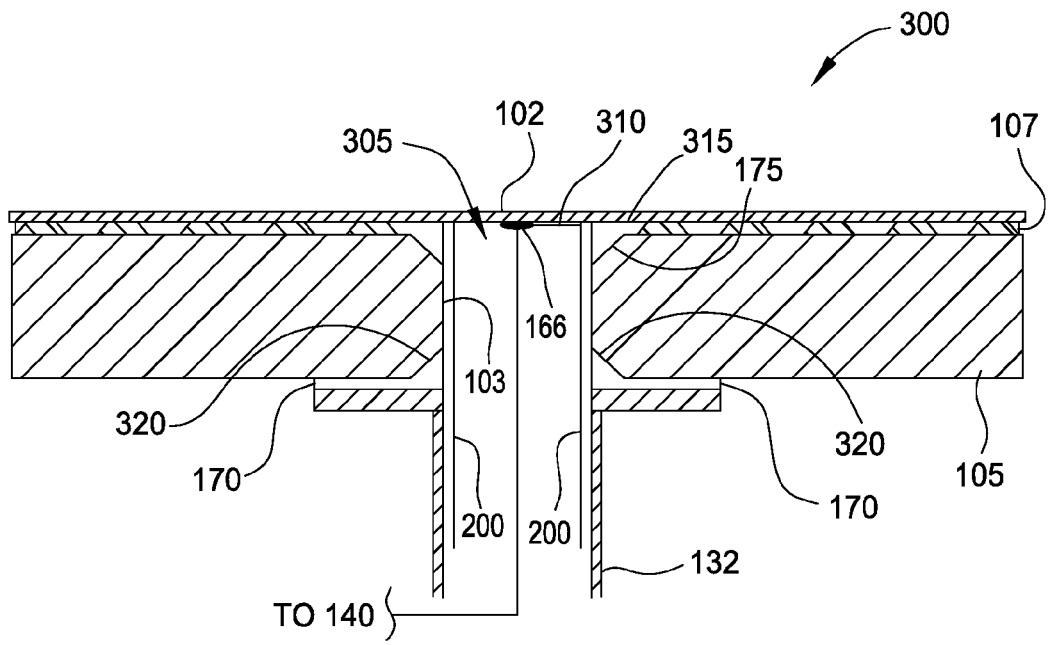
FIG. 3 is a schematic, cross-sectional view of another substrate support assembly that may benefit from the invention.

FIG. 3 is a schematic, cross-sectional view of another substrate support assembly 300 that may benefit from the invention. The substrate support assembly 300 includes an electrostatic chuck 105 disposed on a conductive gas conduit 132 similar to the embodiment shown in FIG. 1. The electrostatic chuck 105 includes chucking electrodes (not shown) and is electrically coupled to a power source and gas source (both not shown) similar to the configuration shown in FIG. 1. The electrostatic chuck 105 has a substrate spacing mask 107 disposed on the upper surface thereof. A center tap structure 305 is disposed in the conductive passage 103. The center tap structure 305 includes the center tap 166 that is coupled to the conductive passage 103 by an extended member 310. The center tap structure 305 also includes a conductive member 315 that extends away from the center of the conductive passage 103 and is in contact with the backside of the substrate 102. The center tap structure 305 forms the balancing circuit as described in FIG. 1.

Similar to the substrate support assembly 100 of FIG. 1, the electrical connection between the conductive gas conduit 132 and the conductive passage 103 may become severed during use and/or during removal of the electrostatic chuck 105. To repair the electrical connection, the coating 200 as described in FIG. 2 is utilized.

Additionally, the electrostatic chuck 105 is modified to include a chamfer 320 at corner regions thereof adjacent the conductive passage 103. The chamfer 320 may be a beveled region that is utilized to reduce stress between the conductive passage 103, and the first brazed joint 170 and the metalized layer 175. The chamfer 320 may also be used to increase surface area available for bonding with the braze material utilized in the first brazed joint 170 and the metalized layer 175. The chamfer 320 thus may be used to reduce stresses on the center tap structure 305 and/or the conductive passage 103 to prevent or minimize damage to the electrical connection between the conductive gas conduit 132 and the conductive passage 103 during use and/or during removal of the electrostatic chuck 105.

Figure 4:
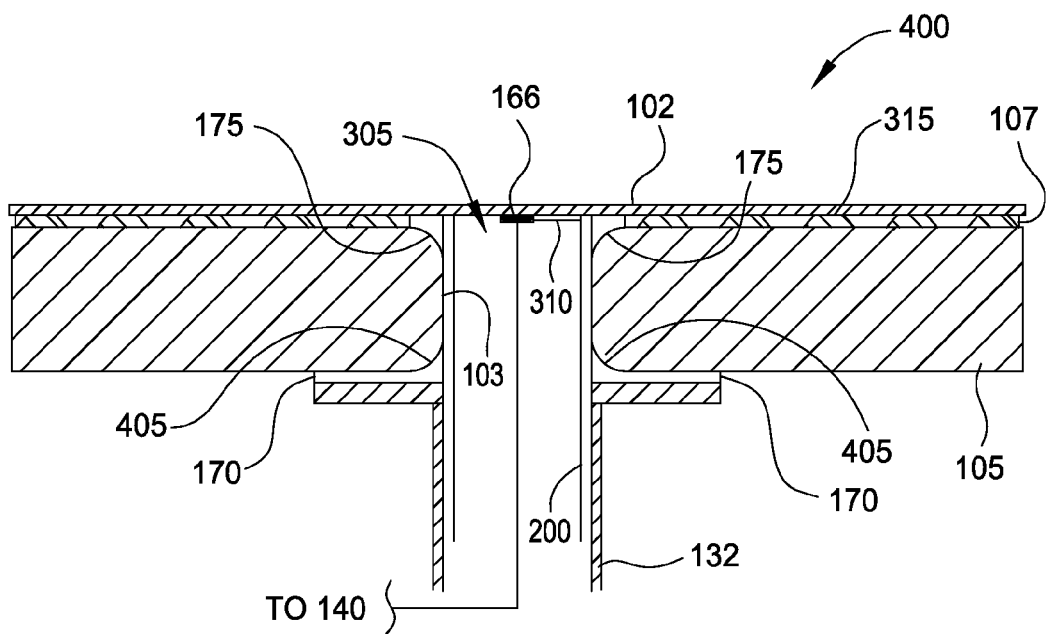
FIG. 4 is a schematic, cross-sectional view of another substrate support assembly that may benefit from the invention.

FIG. 4 is a schematic, cross-sectional view of another substrate support assembly 400 that may benefit from the invention. The substrate support assembly 400 includes an electrostatic chuck 105 disposed on a conductive gas conduit 132 similar to the embodiment shown in FIG. 1. The electrostatic chuck 105 includes chucking electrodes (not shown) and is electrically coupled to a power source and gas source (both not shown) similar to the configuration shown in FIG. 1. The substrate support assembly 400 is identical to the substrate support assembly 300 of FIG. 3 with the exception of a radius 405 at corner regions of the electrostatic chuck 105 adjacent the conductive passage 103. The radius 405 may be utilized to reduce stress between the conductive passage 103, and the first brazed joint 170 and the metalized layer 175. The radius 405 may also be used to increase surface area available for bonding with the braze material utilized in the first brazed joint 170 and the metalized layer 175. The radius 405 thus may be used to reduce stresses on the center tap structure 305 and/or the conductive passage 103 to prevent or minimize damage to the electrical connection between the conductive gas conduit 132 and the conductive passage 103 during use and/or during removal of the electrostatic chuck 105.

Figure 5:
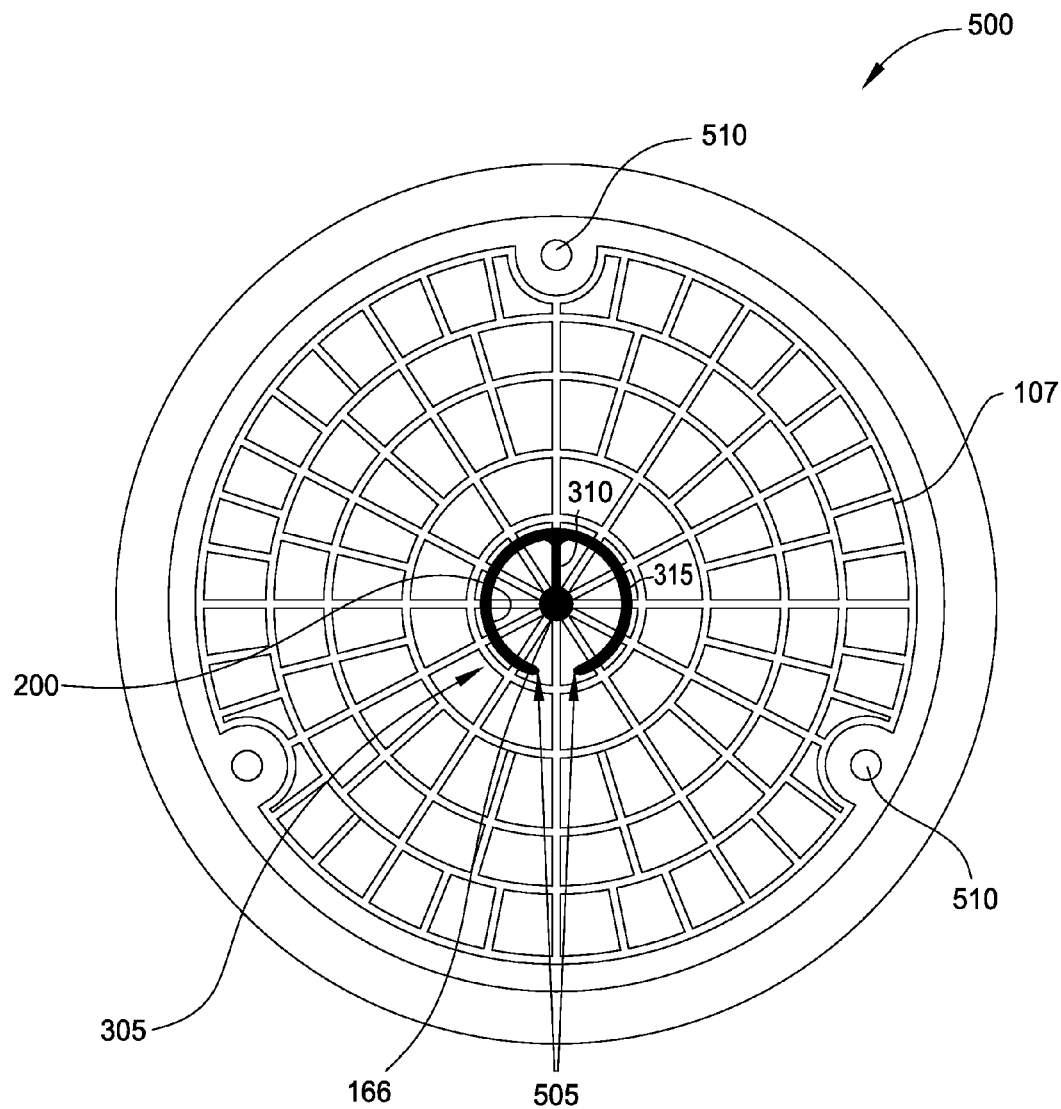
FIG. 5 is a schematic top plan view of a substrate support assembly showing the center tap structure described in FIGS. 3 and 4.

FIG. 5 is a schematic top plan view of a substrate support assembly 500 showing the center tap structure 305 described in FIGS. 3 and 4. The center tap structure 305 includes the conductive member 315 having ends 505 that define an open region therebetween.

Embodiments described herein provide apparatus and methods for repairing a broken electrical circuit in an electrostatic chuck. The coating and method as described herein provides a more economical and faster repair of the electrical connection as compared to laser and e-beam welding techniques, which greatly reduces cost of ownership. The coating 200 also extends the lifetime of the electrostatic chuck 105 by providing improved electrical contact that is uniform and more robust.

While the foregoing is directed to embodiments of the present invention, other and further embodiments of the invention may be devised without departing from the basic scope thereof, and the scope thereof is determined by the claims that follow.

The invention claimed is:

1. A method for repairing a severed electrical connection within a balancing circuit of an electrostatic chuck assembly, the electrical connection being disposed between a conductive tubing and a metalized layer disposed on an upper surface of the electrostatic chuck, the method comprising:
   determining an electrical resistance between a substrate spacing mask at least partially coupled to the metalized layer and disposed on the upper surface of the electrostatic chuck and the conductive tubing which extends from a lower surface of the electrostatic chuck and is axially aligned with an aperture extending through the electrostatic chuck;

evaluating the determined resistance to determine whether an electrical connection between the conductive tubing and the substrate spacing mask has been severed; and repairing the severed connection by restoring a conductive path between the conductive tubing and the substrate spacing mask by applying a coating comprising a nano-particle conductive material.

2. The method of claim 1, wherein the nano-particle conductive material comprises a fluid.

3. The method of claim 2, wherein the nano-particle conductive material comprises a silver paste.

4. The method of claim 1, wherein the nano-particle conductive material comprises a silver ink.

5. The method of claim 1, wherein the nano-particle conductive material includes a thickness of about 500 nanometers to about 5 microns.

* * * * *